US006710262B2

(12) United States Patent
Takada et al.

(10) Patent No.: US 6,710,262 B2
(45) Date of Patent: Mar. 23, 2004

(54) FLAT HARNESS ASSEMBLING APPARATUS AND METHOD

(75) Inventors: Hiroshi Takada, Yokkaichi (JP); Isao Mori, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/414,009

(22) Filed: Apr. 16, 2003

(65) Prior Publication Data

US 2003/0213609 A1 Nov. 20, 2003

(30) Foreign Application Priority Data

May 14, 2002 (JP) ....................................... 2002/138998

(51) Int. Cl.[7] ................................................ H05K 1/02
(52) U.S. Cl. ........................ 174/259; 174/72 A; 174/93
(58) Field of Search ................................ 174/72 A, 93, 174/84 C, 259, 99 R; 156/196

(56) References Cited

U.S. PATENT DOCUMENTS 4,908,348 A * 3/1990 Hung et al. ................. 505/220

FOREIGN PATENT DOCUMENTS

JP 10283857 10/1998

OTHER PUBLICATIONS

English Language Abstract of JP Appln. No. 10–283857.

* cited by examiner

*Primary Examiner*—Dean A. Reichard
*Assistant Examiner*—Jinhee Lee
(74) *Attorney, Agent, or Firm*—Greenblum & Bernstein, P.L.C.

(57) ABSTRACT

A flat harness assembling apparatus and method are provided for covering juxtaposed electric wires with a sheet having a pressure sensitive adhesive on a surface thereof. A covering device for assembling the sheet around the plurality of juxtaposed wires includes a central plate on which a central portion of the sheet is mounted, a first side plate connected through a hinge portion to a side edge of the central plate in a foldable manner, and a second side plate connected through a hinge portion to an opposite side edge of the central plate in a foldable manner. The covering device also includes an engagement device having an engagement plate for holding a sheet mounted on the central plate and the first and second side plates.

20 Claims, 9 Drawing Sheets

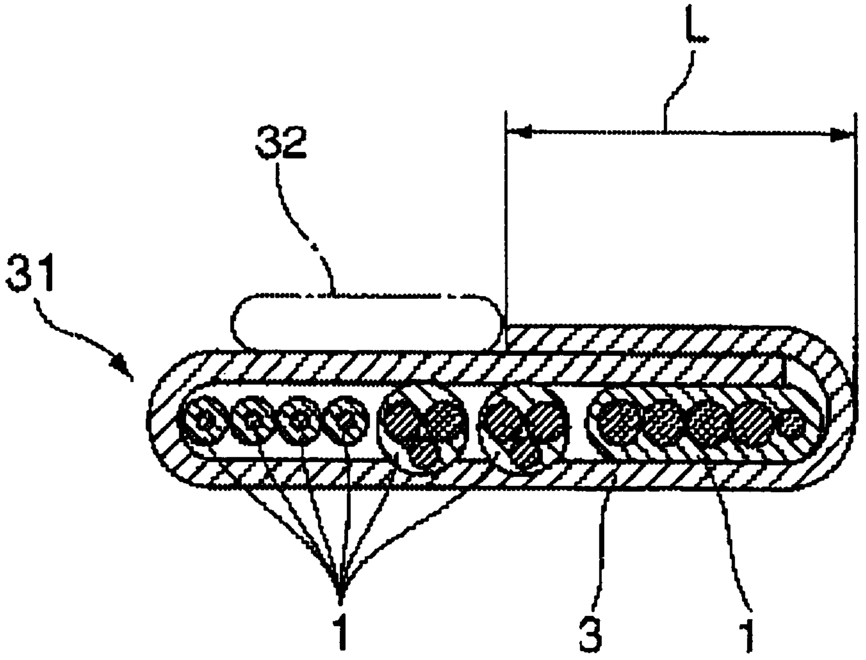
Fig. 9
Fig. 10
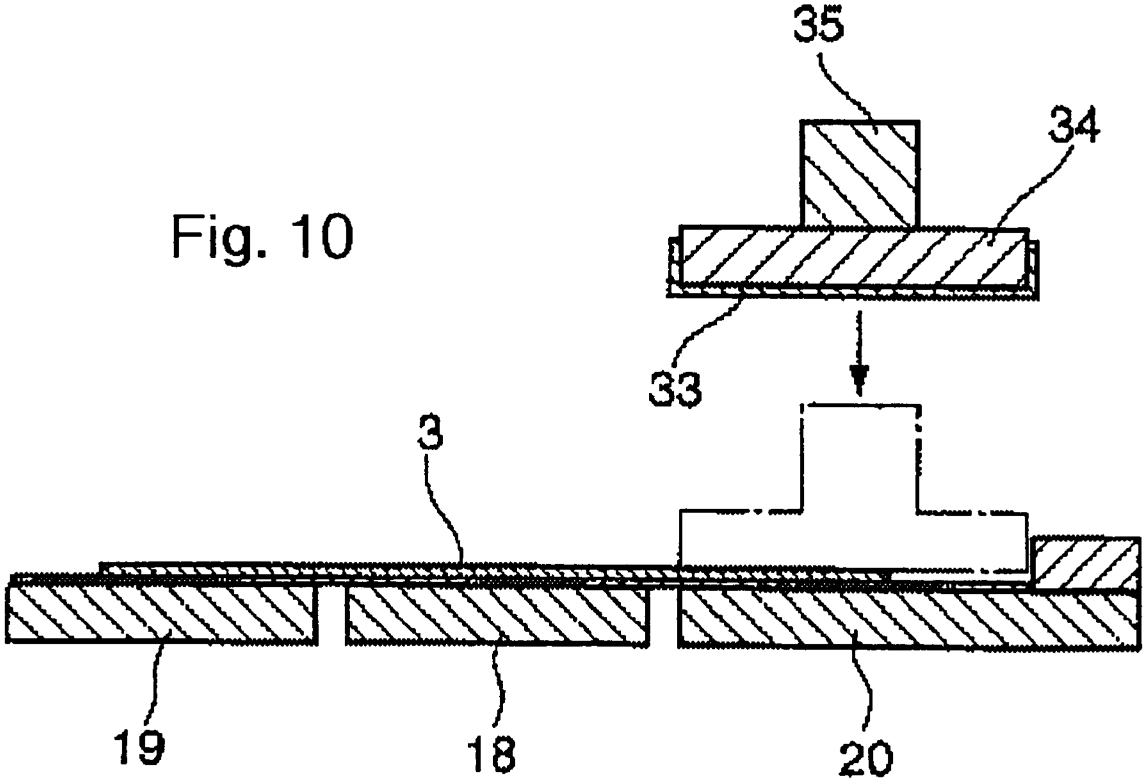

FLAT HARNESS ASSEMBLING APPARATUS AND METHOD

BACKGROUND OF THE INVENTION

1. Field of the Invention

The present invention relates to an apparatus and method for assembling a flat harness in which juxtaposed electric wires are covered with a sheet.

2. Description of the Related Art

A method for producing a flat harness in which a plurality of electric wires are laterally arranged in a flat form and integrated with one another is disclosed in Japanese Patent Public Disclosure No. HEI 9-29015. In this method, a plurality of electric wires are arranged in a flat plane to form a harness, and are disposed on a central portion of a flexible sheet having a hot melt adhesive on a surface thereof. Opposite side ends of the sheet, which extend beyond opposite side ends of the flat harness, are folded over onto the harness. Distal parts of the opposite side ends of the sheet are overlapped on the harness. In this condition, the harness and sheet are clamped between upper and lower dies of a heating press machine, and are heated and pressed to be joined together.

In this manner, a plurality of electric wires are arranged in a flat form and covered with a sheet, on which a hot melt adhesive is applied, to produce a flat harness. Such a flat harness is suitable for containment in a narrow space, such as the space between a roof panel and a molded ceiling in a vehicle, such as an automobile. However, an apparatus for producing such a flat harness can be large and involve complex processes.

For example, in order to envelope the harness having a plurality of electric wires together with a sheet provided with hot melt adhesive on a surface, it is necessary to incorporate a heating device in a molding press in order to soften the hot melt adhesive. This necessarily involves the provision of a large scale production apparatus. In order to carry out a suitable heat pressing process in a molding press, the following steps are required. The opposite side ends of the sheet must be folded to make creases on the sheet, and then unfolded or returned to their original position. Next, the sheet must be enveloped around the harnss wires to temporarily hold them, prior to heating and pressing.

A sheet provided with a pressure sensitive adhesive on a surface of the sheet may be used instead of a sheet on which hot melt adhesive is applied. However, a worker will often touch the pressure sensitive adhesive inadvertently, which will interfere with the assembly and covering process. Furthermore, it is difficult to properly cover the harness wires with the she(t in a compact manner while tightly attaching the sheet to the opposite side ends of the juxtaposed harness wires.

SUMMARY OF THE INVENTION

The present invention has been made in view of the above described situation. Accordingly, an object of the present invention is to provide apparatus and method for easily and properly producing a flat harness by covering juxtaposed electric wires with a sheet having a pressure sensitive adhesive on a surface thereof.

According to one aspect of the present invention, there is provided an apparatus for assembling a flat harness in which a plurality of juxtaposed electric wires are covered by a sheet having a pressure sensitive adhesive layer on a first surface thereof. The apparatus includes a covering device for assembling the sheet around the plurality of juxtaposed wires. The covering device includes a central plate on which a central portion of the sheet is supported, a first side plate connected through a first hinge portion to a first side edge of the central plate in a foldable manner for supporting a first lateral portion of the sheet, and a second side plate connected through a second hinge portion to a second side edge of the central plate in a foldable manner for supporting a second lateral portion of the sheet. The covering device also includes an engagement device for holding the sheet supported on the ceniral plate the first side plate, and the second side plate.

According to a further aspect of the present invention, the engagement device includes an engagement plate having a surface which is configured to contact the first surface of the sheet. The engagement plate may be connected through a third hinge portion to a side edge of the second side plate in a foldable manner. The surface of the engagement plate may include a release agent layer provided thereon.

According to a further aspect of the present invention, the engagement device includes a suction source for applying a negative pressure to a second surface of the sheet. Further, the central plate may include a porous plate provided on an upper surface thereof, and the suction source may apply the negative pressure to the second surface of the sheet through the porous plate.

According to a further aspect of the present invention, the covering device may further include a sheet positioner for aligning the sheet in a predetermined position on the central plate, the first side plate and the second side plate. The sheet positioner may include a sheet end positioning portion for aligning an end of the sheet. The sheet end positioning portion may be provided on the second side plate. The sheet positioner may include sheet lateral edge positioning portions for aligning lateral edges of the sheet. The sheet lateral edge positioning portions may be provided on the central plate, the first side plate and the second side plate.

According to a further aspect of the present invention, at least one clamp member for holding a portion of the plurality of juxtaposed electric wires may be provided. Further, two clamp members may be provided for holding opposite end portions of the plurality of juxtaposed electric wires.

According to a further aspect of the present invention, a support member for supporting the covering device in a position between the two clamp members may be provided. The support member may be movable between a first position in which the covering device is spaced away from the plurality of juxtaposed electric wires and a second position in which the covering device is adjacent to the plurality of juxtaposed electric wires.

According to another aspect of the present invention, a method for assembling a flat harness is provided which includes holding a plurality of juxtaposed electric wires with at least one clamping member, providing a central plate and first and second side plates which are connected in a foldable manner to first and second side edges of the central plate through first and second hinge portions, and providing a sheet having a pressure sensitive adhesive layer on a first surface thereof, wherein the sheet has a central portion, a first lateral portion and a second lateral portion. The method includes mounting the sheet on the central plate, the first side plate and the second side plate, and pressing an engagement plate having a release agent layer onto the second lateral portion of the sheet to hold the second lateral portion of the sheet against the second side plate.

The method further includes disposing the plurality of juxtaposed electric wires on the central portion of the sheet, folding the first side plate onto the central plate such that the first lateral portion of the sheet is folded over and fixed on the plurality of juxtaposed electric wires, releasing the engagement plate from the second lateral portion of the sheet, and folding the second side plate onto the central mounting plate such that the second lateral portion of the sheet is folded over and fixed on the plurality of juxtaposed electric wires.

The method may further include aligning the sheet on the central plate, the first side plate and the second side plate with a sheet positioner.

BRIEF DESCRIPTION OF THE DRAWINGS

The above, and other objects, features and advantages of the present invention will be made apparent from the following description of the preferred embodiments, given as nonlimiting examples, with reference to the accompanying drawings in which:

FIG. 9 is a cross sectional view of the flat harness of FIG. 8;

FIG. 10 is a cross sectional view of another embodiment of a covering device for assembling a sheet around a plurality of juxtaposed wires in accordance with the present invention;

DETAILED DESCRIPTION OF THE PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Embodiments of the present invention will be described below with reference to the drawings.

Figure 1:
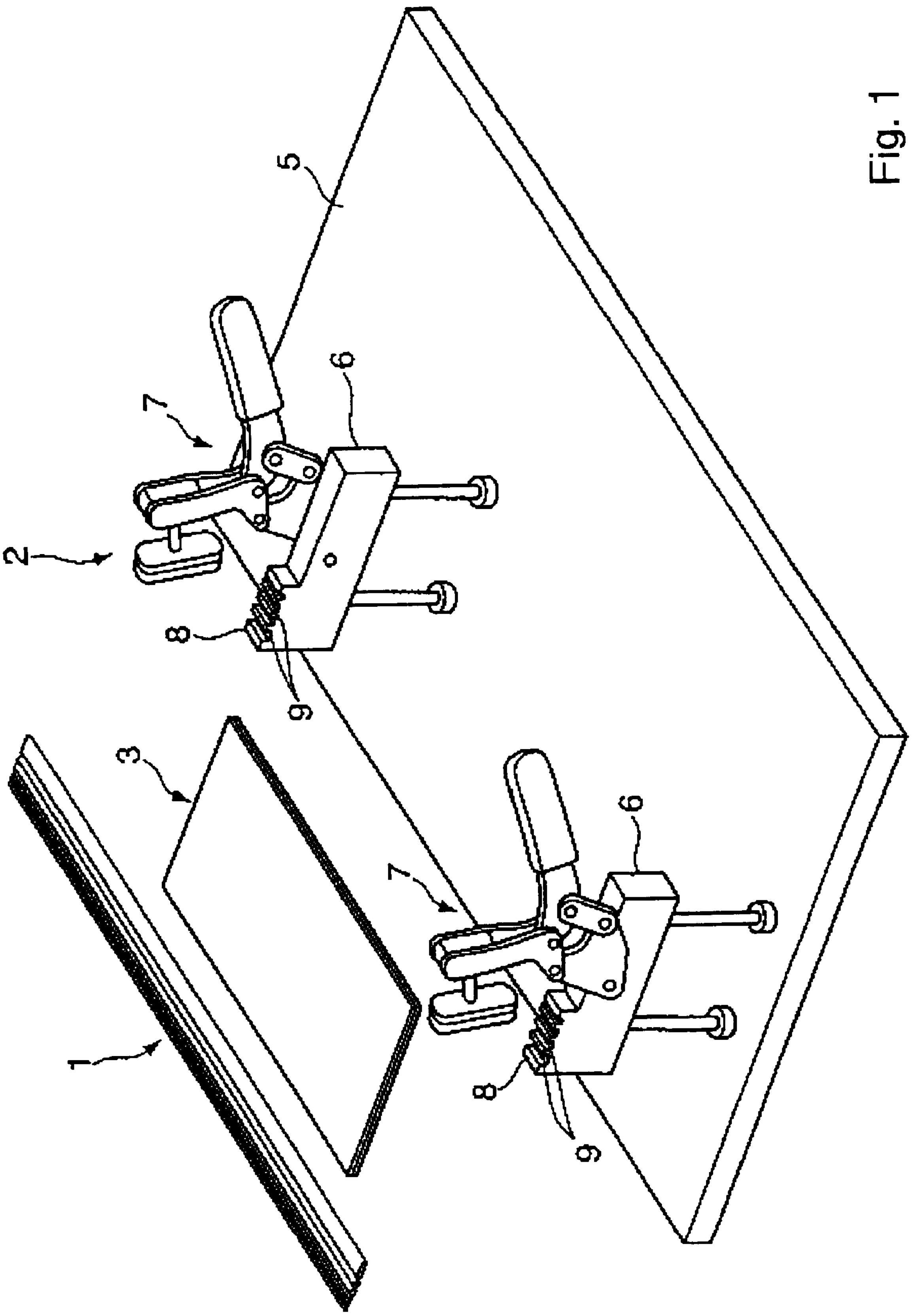
FIG. 1 is a perspective view of an embodiment of a flat harness assembling apparatus in accordance with the present invention.
Figure 2:
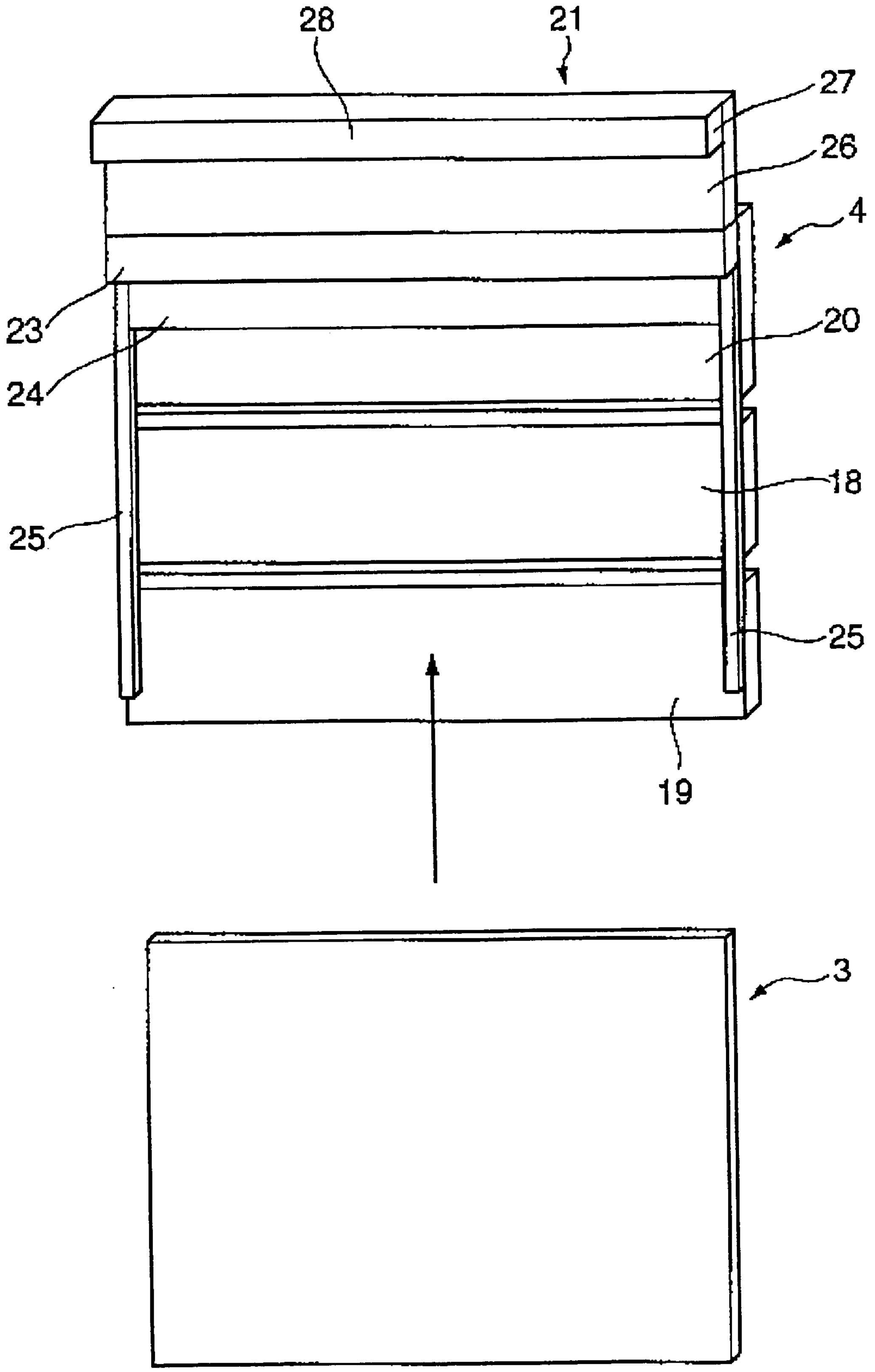
FIG. 2 is a perspective view of an embodiment of a covering device for assembling a sheet around a plurality of juxtaposed wires in accordance with the present invention.
Figure 3:
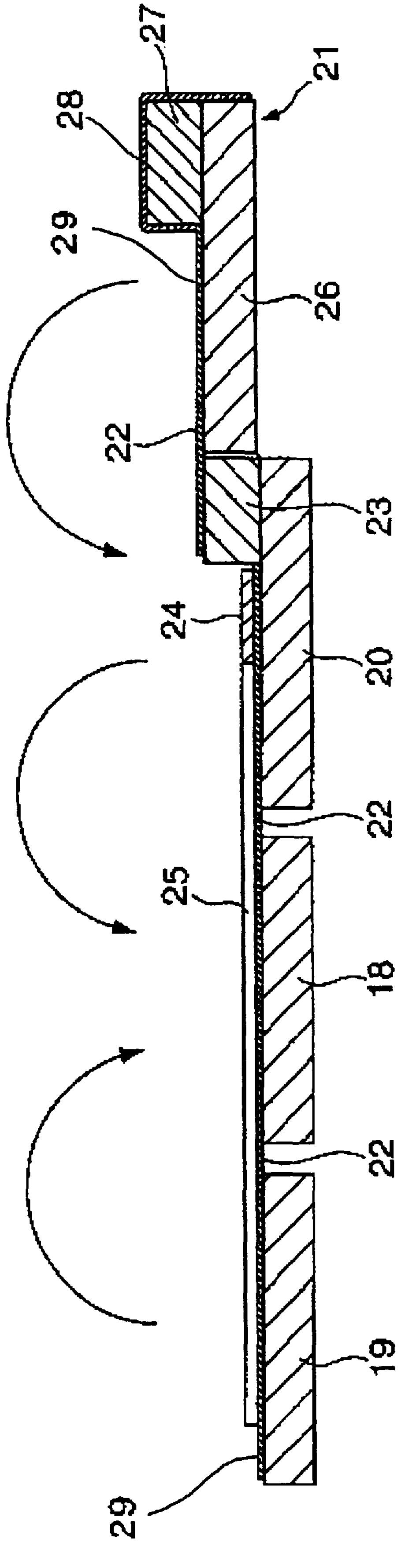
FIG. 3 is a cross sectional view of the covering device of FIG. 2.

FIGS. 1 to 3 show an embodiment of a flat harness assembling apparatus in accordance with the present invention. The flat harness assembling apparatus includes a pair of clamping members 2 that position and hold juxtaposed electric wires 1, and a covering device 4 to be used for covering the electric wires 1 with a sheet 3.

The sheet 3 may be made of any material having suitable elasticity and shape-retention characteristics, such as urethane foam. The sheet 3 may be any suitable thickness, such as 1 mm, and a width sufficient to cover the rear and front surfaces of the electric wires 1. A suitable pressure sensitive adhesive is applied to a surface of the sheet to form a pressure sensitive adhesive layer. A separate removable sheet, such as paper, may be attached to the pressure sensitive adhesive layer in order to protect it prior to use.

Each clamping member 2 includes a support block 6 standing on a support board 5, a clamping mechanism 7 provided on a rear portion of the support block 6, and an electric wire support portion 8 provided on an upper surface of the support block 6. A plurality of support grooves 9 are provided in the electric wire support portion 8, and are configured for supporting various types of electric wires 1. The respective electric wires 1 are supported in the respective support grooves 9 to laterally position the electric wires 1.

Figure 4:
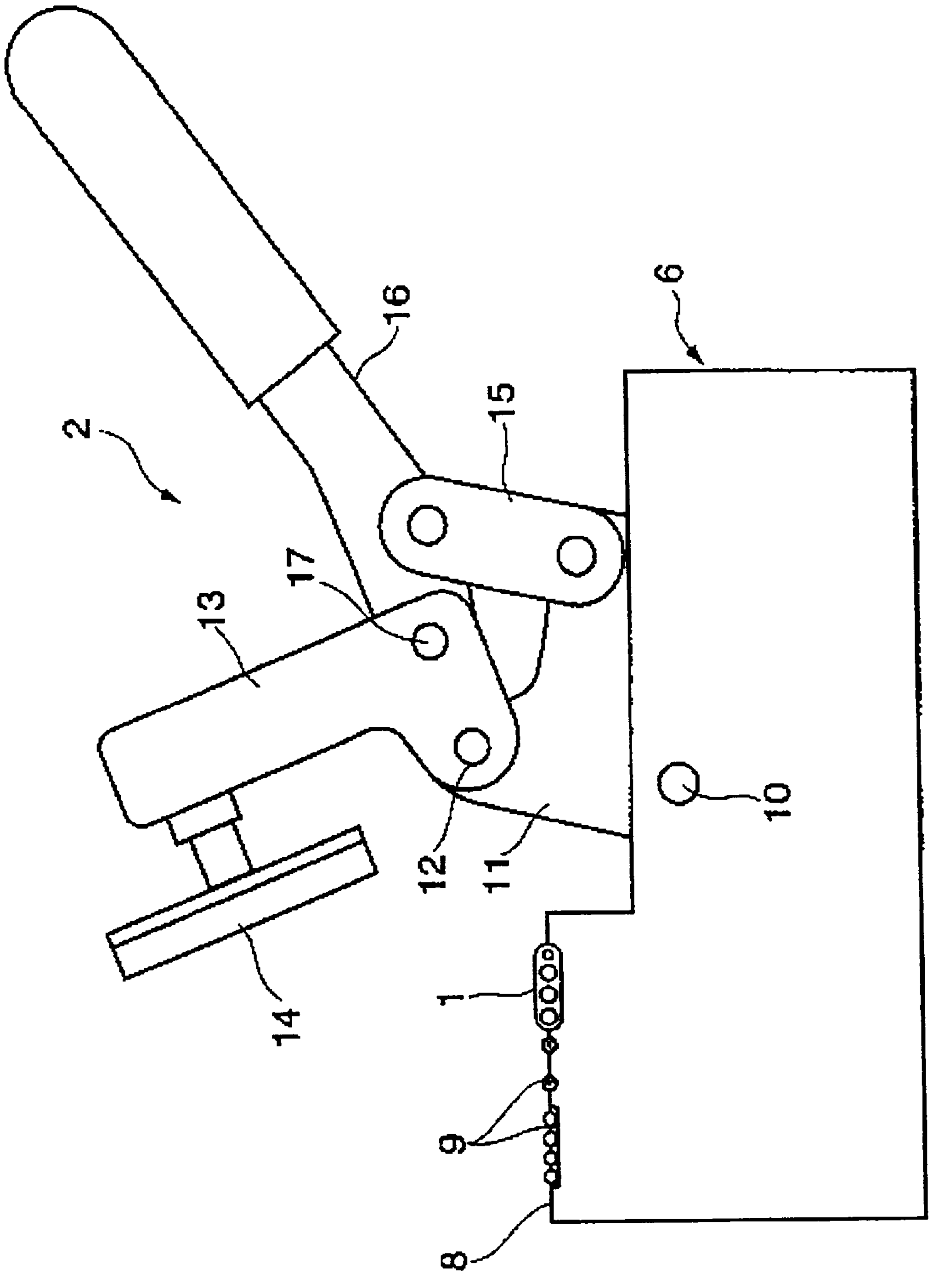
FIG. 4 is a side view of a clamp member shown in FIG. 1, illustrating an open condition.
Figure 5:
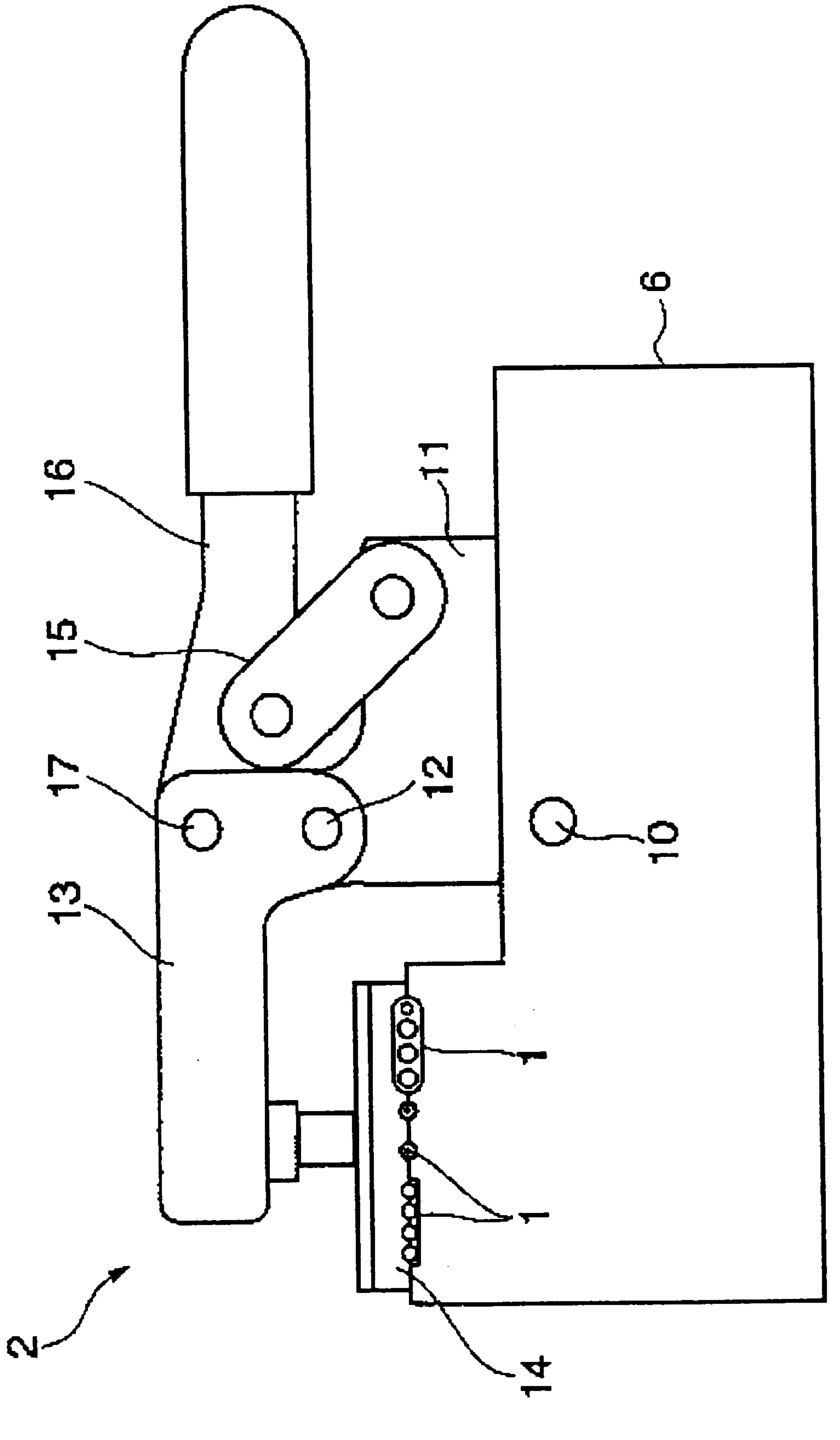
FIG. 5 is a side view of a clamp member shown in FIG. 1, illustrating a closed or clamping condition.

As shown in FIGS. 4 and 5, each clamping mechanism 7 includes a support plate 11 having a lower end supported through a support axle 10 on the support block 6, a rocking arm 13 having a proximal end supported through a support axle 12 on the support plate 11, a pressing member 14 made of any suitable material, such as a synthetic rubber, and secured to a distal end of the rocking arm 13, and an operating lever 16 coupled through a link member 15 to an upper rear end of the support plate 11. A distal end of the operating lever 16 is coupled through a coupling axle 17 to a proximal end of the rocking arm 13.

The operating lever 16 can rotate the rocking arm 13 between a retracted position shown in FIG. 4 and a clamping position shown in FIG. 5. The pressing member 14 presses upper surfaces of the electric wires 1 to clamp the electric wires 1 between the pressing member 14 and the electric wire support portion 8. The clamping mechanism 7 may be provided with a locking portion (not shown) for detachably holding the rocking arm 13 in the clamping position.

FIGS. 2 and 3 show an embodiment of a covering device 4 for assembling a sheet around a plurality of juxtaposed wires of a flat harness. The covering device 4 includes a central plate 18 on which a central portion of the sheet 3 is mounted, a first side plate 19 coupled to a side edge of the central plate 18 in a foldable manner, a second side plate 20 coupled to the other side edge of the central plate 18 in a foldable manner, and an engagement plate 21 coupled to the second side plate 20 in a foldable manner.

The central plate 18, first side plate 19, second side plate 20 and engagement plate 21 are made of any suitable material, such as synthetic resin or metal. They are coupled to one another in a foldable manner by any suitable structure, such as by hinge portions 22. A longitudinal dimension of the central plate 18 may be slightly greater than a length of the sheet 3 while a lateral dimension of the central plate 18 is about one third of a width of the sheet 3. Thus, the central portion of the sheet 3 may be disposed on the central plate 18.

Longitudinal and lateral dimensions of the first side plate 19 may be substantially the same as those of the central plate 18. A longitudinal dimension of the second side plate 20 may also be substantially the same as that of the central plate 18. The first and second side plates 19 and 20 and central plate 18 are juxtaposed and spaced a predetermined distance away from one another. A transparent thin flexible tape 29 is adhered to upper surfaces of the plates 18, 19 and 20. The first and second side plates 19 and 20 are coupled to the opposite side edges of the central plate 18 through hinge sections 22, which may be formed by the transparent thin tape 29 extending between the spaced plates.

A bar member 23 having a predetermined width is secured on an upper surface of a distal side end (free end) of the second side plate 20. An engagement plate 21 is provided along a side surface of the bar member 23. A transparent thin flexible tape 29 is adhered to upper surfaces of the bar member 23 and the engagement plate 21. The second side plate 20 and engagement plate 21 are interconnected in a foldable manner through a hinge section 22, which may be may be formed by the transparent thin flexible tape 29 extending therebetween.

A sheet positioner having substantially the same thickness as the sheet 3 is secured to upper surfaces of the central plate 18, the first side plate 19 and the second side plate 20. A sheet end positioning portion 24 of the sheet positioner is provided on the second side plate 20 along the bar member 23, in order to align an end of the sheet 3. Lateral edge positioning portions 25 of the sheet positioner are provided on the plates 18, 19 and 20, in order to align opposite lateral edges of the sheet 3.

The engagement plate 21 includes a third side plate 26 having substantially the same longitudinal and lateral dimensions as the second side plate 20, and a bar member 27 secured to an upper surface of a distal side end of the third side plate 26. A release agent of any suitable material, such as a silicone base material or a fluorine base material, is adhered to an upper surface of the bar member 27 to form a release agent layer 28. The release agent may be applied to an adherent tape for application to the bar member 27.

A method for assembling a flat harness using the flat harness assembling apparatus including a covering device 4 as described above will be explained below. Firstly, after the clamping members 2 hold a plurality of electric wires 1, the sheet 3 is disposed on the covering device 4. That is, as shown in FIGS. 2 and 3, the central plate 18, first and second side plates 19 and 20, and engagement plate 21 of the covering device 4 are unfolded. The sheet 3, from which the release paper is removed, is mounted on the central plate 18 and first and second side plates 19 and 20. A side end and opposite right and left lateral edges of the sheet 3 are brought into contact with the positioning portions 24 and 25 to align the sheet 3.

Figure 6A:
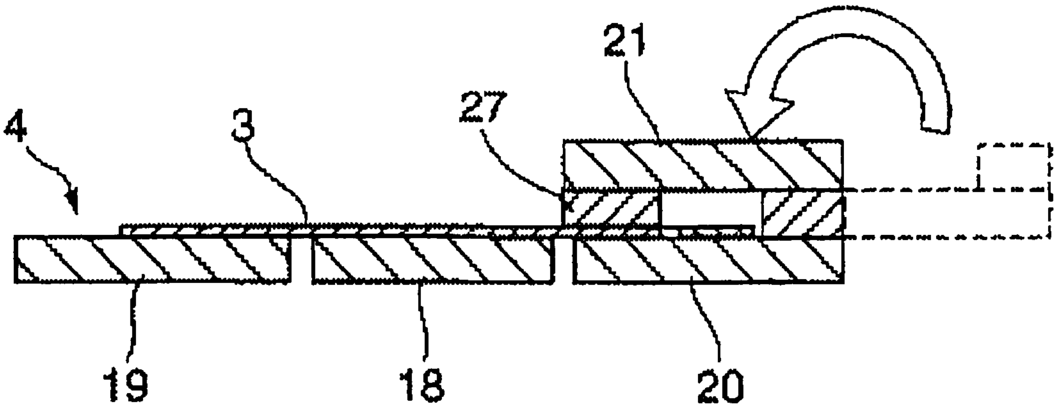
FIGS. 6A to 6C are views showing initial steps of a flat harness assembling method in accordance with the present invention, using the covering device shown in FIG. 2.
Figure 6B:
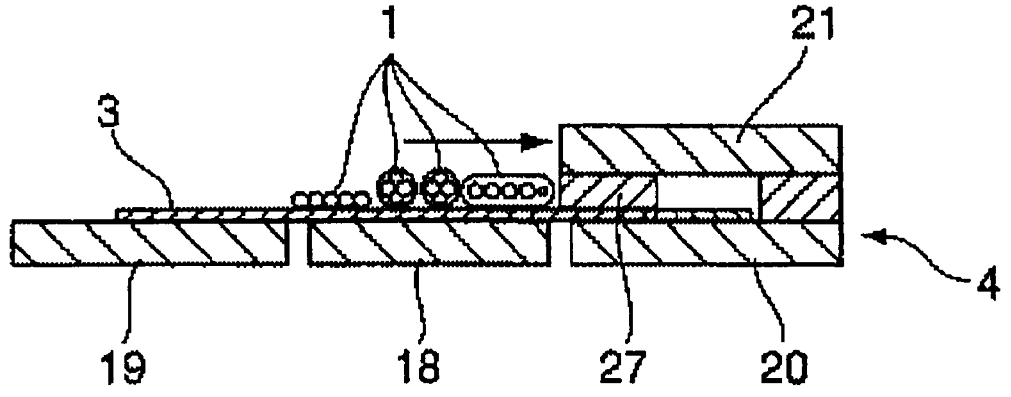

Secondly, as shown in FIG. 6A, the engagement plate 21 of the covering device 4 is folded onto the second side plate 20. The bar member 27 provided with the release agent layer 28 presses the surface of a lateral portion of the sheet 3. The covering device 4 is moved below the electric wires 1 held by the clamping members 2. When the covering device 4 is raised, as shown in FIG. 6B, the front surface of the sheet 3 is pressed onto the bottom surfaces of the electric wires 1 to adhere the electric wires 1 to the pressure sensitive adhesive layer on the sheet 3. In this manner, it is possible to dispose the electric wires 1 on a given position on the central portion of the sheet 3 by positioning the electric wires 1 with respect to the bar member 27 of the covering device 4.

Figure 6C:
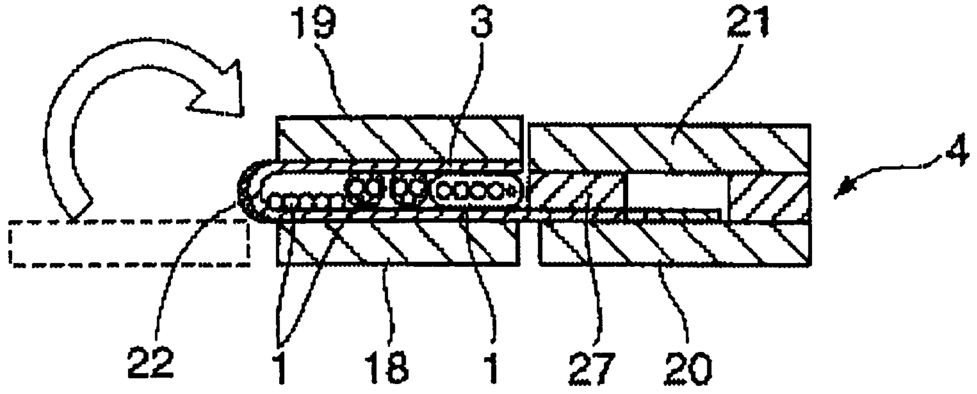
Figure 7A:
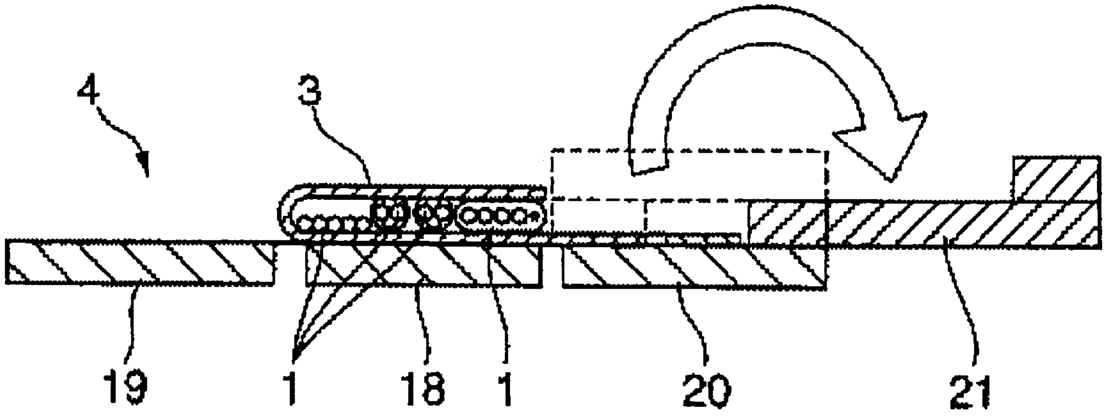
FIGS. 7A and 7B are views showing additional steps of a flat harness assembling method in accordance with the present invention, using the covering device shown in FIG. 2.
Figure 7B:
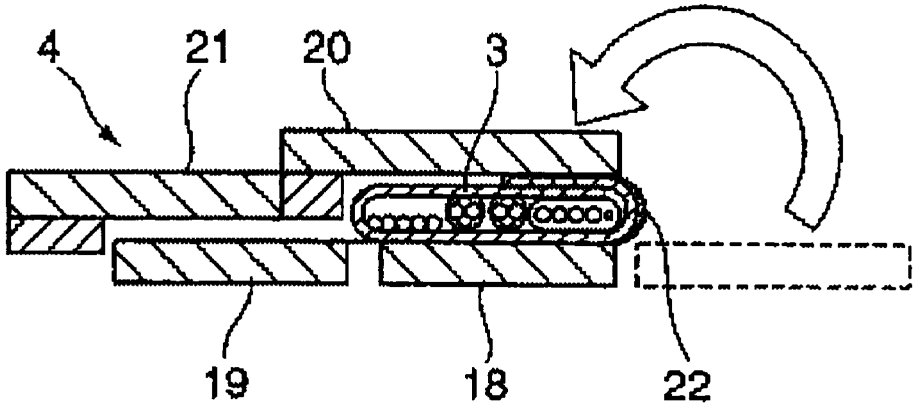

Thereafter, as shown in FIG. 6C, the first side plate 19 is folded onto the central plate 18 to overlap and adhere the lateral end of the sheet 3 onto the top surfaces of the electric wires 1. Then, as shown in FIG. 7A, the first side plate 19 and engagement plate 21 are unfolded. After the sheet 3 is released, as shown in FIG. 7B, the second side plate 20 is folded onto the central plate 18 to overlap and adhere the other lateral end of the sheet 3 onto the electric wires 1.

Figure 8:
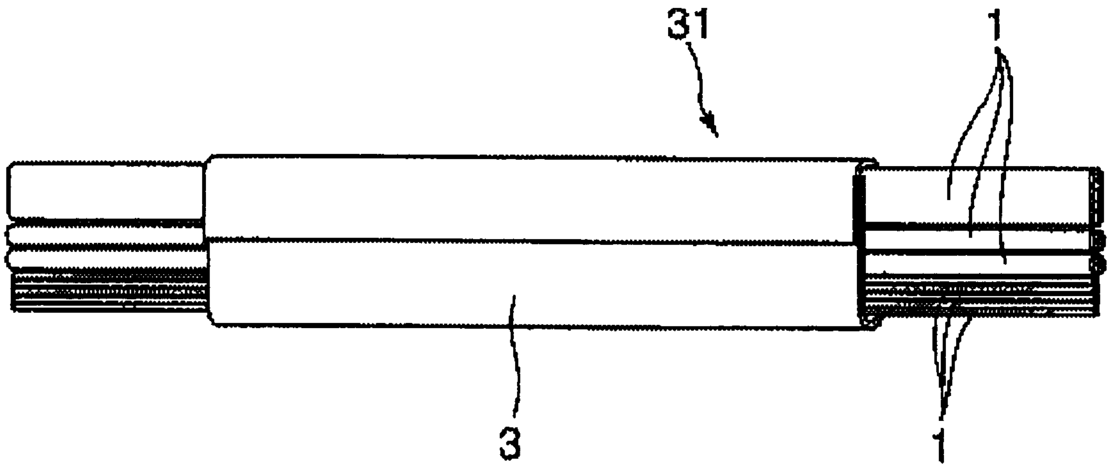
FIG. 8 is a view of a flat harness including electric wires covered with a sheet.

As described above, the electric wires 1 are covered with the sheet 3 by using the covering device 4, as shown in FIGS. 8 and 9. Accordingly, it is possible to easily and properly assemble a flat harness 31 suitable for being arranged in a narrow space defined between a roof panel and a molded ceiling in a vehicle such as an automobile. That is, the engagement plate 21 holds a lateral end of the sheet 3 mounted on the central plate 18 and first and second side plates 19 and 20 of the covering device 4. The first side plate 19 is folded onto the central plate 18. After releasing the engagement plate 21 from the sheet 3, the second side plate 20 is folded onto the central plate 20. The sheet 3 provided with the pressure sensitive adhesive layer on the surface thereof covers the top and bottom surfaces of the electric wires 1. Accordingly, it is possible to cover the electric wires 1 together with the sheet by using the covering device 4 without any problems caused by a worker inadvertently touching the pressure sensitive adhesive layer on the sheet 3.

It is possible to c over the electric wires 1 with the sheet 3 so that the sheet 3 closely aligns with the right and left side ends of the electric wires without causing any clearances between the electric wires 1 and the folded portions of the sheet 3, if a width of the central plate 18 is the same as a width of the electric wires 1. Furthermore, it is possible to precisely align a covering position of the sheet 3 with respect to the electric wires 1 by using the positioning portions 24 and 25 to precisely set the sheet mounting position. Accordingly, as shown in FIG. 9, it is possible to precisely set a distance L from a side end of the flat harness 31 to a folded position of the sheet 3. It is also possible to properly arrange other electric wires 32 on the flat harness 31 with respect to the folded position of the sheet 3.

As described above, a sheet positioner portion having substantially the same thickness as that of the sheet 3 is adhered to the upper surface of the second side plate 20. Further, a sheet positioner portion having substantially the same thickness as that of the sheet 3 is adhered to left and right portions of the upper surfaces of the central plate 18 and the first and second side plates 19 and 20. It is also possible to position the sheet 3 on the central plate 18 and first and second side plates 19 and 20 by applying color-code indicators on an mounting area of the sheet 3 instead of providing the positioning portions 24 and 25.

As shown in the above embodiment, the engagement device including the engagement plate 21 connected through the hinge portion 22 to the side edge of the second side plate 20 is provided on the covering device 4. It is possible to clamp and hold the sheet 3 between the engagement plate 21 and the second side plate 20 by mounting the sheet 3, which is provided with the pressure sensitive adhesive layer on a surface thereof, on the central plate 18 and first and second side plates 19 and 20, and by folding the engagement plate 21 onto the second side plate 20. It is also possible to prevent the sheet 3 from being damaged while releasing the sheet 3 from the engagement plate 21, since the separate agent layer 28 on the engagement plate 21 permits easy separation of the engagement plate 21 from the sheet 3.

As shown in FIG. 10, another embodiment of an engagement device may include a separate engagement plate 34 provided with a release agent layer 33 on a bottom surface thereof, and a grip 35 secured to an upper surface of the engagement plate 34. The separate engagement plate 34 is not connected to the central plate 18 and first and second side plates 19 and 20. The sheet 3 provided with the pressure sensitive adhesive on a surface thereof is mounted on the central plate 18 and first and second side plates 19 and 20. The engagement plate 34 holds the sheet 3 by pressing the release agent layer 33 onto the lateral end of the sheet 3.

Figure 11:
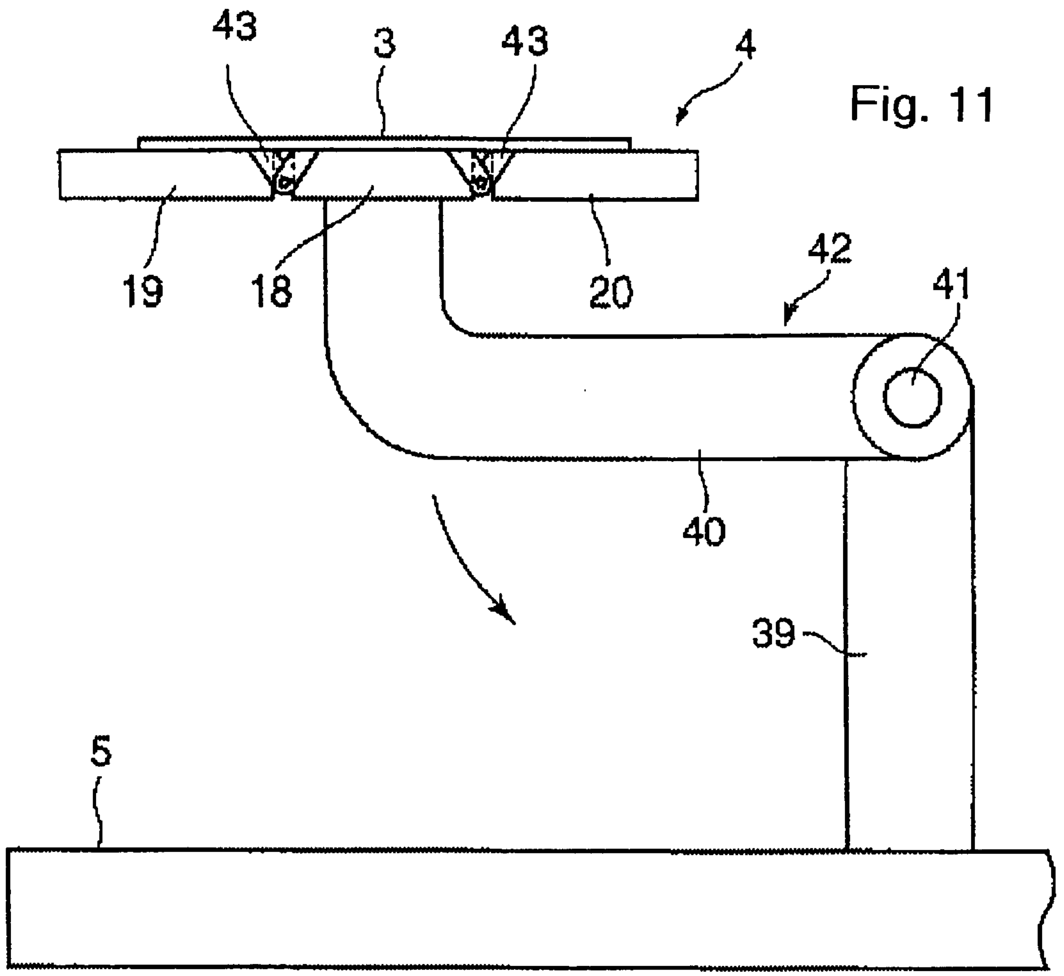
FIG. 11 is a side view of another embodiment of a flat harness assembling apparatus in accordance with the present invention.

The hinge portions 22 are made of the transparent thin tape connecting the first and second side plates 19 and 20 to the opposite side edges of the central plate 18 in the above embodiment. As shown in the embodiment of FIG. 11, hinges 43 may instead be provided for connecting the first and second side plates 19 and 20 to the opposite side edges of the central plate 18.

Figure 12:
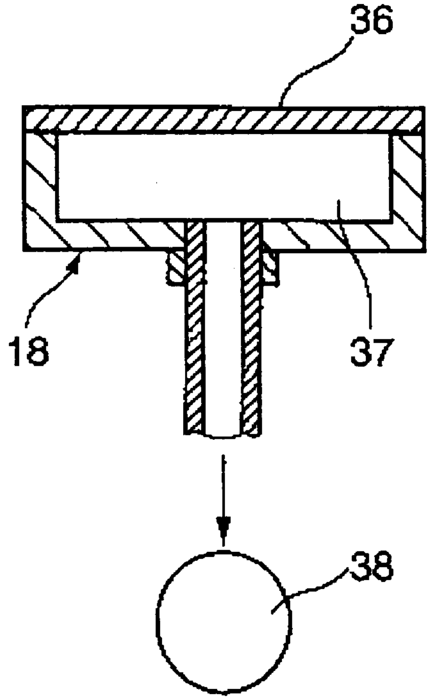
FIG. 12 is a cross sectional view of another embodiment of an engagement device in accordance with the present invention.

As shown in FIG. 12, a porous plate 36 formed of any suitable material, such as a sintered metal or a perforated metal plate, may be provided on an upper surface of the central plate 18. In this embodiment, the engagement device includes a suction source 38, such as a vacuum pump, to apply a negative pressure to a sealed interior 37 in the central plate 18 to suck the bottom surface of the sheet 3 onto the porous plate 36.

According to the above construction, the sheet 3 provided with the pressure sensitive adhesive layer on the surface of the sheet 3 is mounted on the central plate 18 and first and second side plates 19 and 20. The suction source 38 is actuated to suck the central portion of the sheet 3 onto the central plate 18. The first side plate 19 is folded onto the central plate 18 to overlap and fix the lateral end of the sheet 3 onto the electric wires 1. Then, the second side plate 20 is folded onto the central plate 18 to overlap and fix the other lateral end of the sheet 3 onto the electric wires 1.

As shown in the above embodiment, the clamping members 2 clamp the juxtaposed electric wires 1 to position them. The sheet 3 provided with the pressure sensitive adhesive layer on the surface thereof is mounted on the covering device 4. Covering of the electric wires 1 with the sheet 3 can be easily carried out by using the covering device 4.

Furthermore, as shown in FIG. 11, a support unit 42 may be provided which includes a support pole 39 standing on the support board 5 and a rocking bracket 40 supported rotatably on a support axle 41 provided on a top of the support pole 39. The covering device 4, which includes the central plate 18 and first and second side plates 19 and 20, may be supported rotatably between a lower standby position spaced away from the holding position of the electric wires 1 and an upper covering position adjacent to the holding position of the electric wires 1. In this manner, after the sheet 3 is set on the covering device 4 at the lower standby position, the device 4 is moved to the upper covering position. While the engagement device holds the sheet against the covering device 4 at the upper covering position, it is possible to carry out covering of the electric wires 1 with the sheet 3 by using the covering device 4. Further, the support unit 42 can be provided for the covering devices of any of the disclosed embodiments, which include the various engagement devices.

Although the invention has been described with reference to exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent strictures, methods, and uses such as are within the scope of the appended claims.

The present disclosure relates to subject matter contained in priority Japanese Application No. 2002-138998, filed on May 14, 2002, which is herein expressly incorporated by reference in its entirety.

What is claimed is:

1. An apparatus for assembling a flat harness in which a plurality of juxtaposed electric wires are covered by a sheet having a pressure sensitive adhesive layer on a first surface thereof, said apparatus comprising:

a covering device for assembling the sheet around the plurality of juxtaposed wires, said covering device comprising:

a central plate on which a central portion of the sheet is supported;

a first side plate connected through a first hinge portion to a first side edge of said central plate in a foldable manner for supporting a first lateral portion of the sheet;

a second side plate connected through a second hinge portion to a second side edge of said central plate in a foldable manner for supporting a second lateral portion of the sheet; and an engagement device for holding the sheet supported on said central plate, said first side plate and said second side plate.

2. The apparatus for assembling a flat harness according to claim 1, wherein said engagement device includes an engagement plate having a surface which is configured to contact the first surface of the sheet.

3. The apparatus for assembling a flat harness according to claim 2, wherein said engagement plate is connected through a third hinge portion to a side edge of said second side plate in a foldable manner.

4. The apparatus for assembling a flat harness according to claim 2, wherein said surface of said engagement plate includes a release agent layer provided thereon.

5. The apparatus for assembling a flat harness according to claim 1, wherein said engagement device includes a suction source for applying a negative pressure to a second surface of the sheet.

6. The apparatus for assembling a flat harness according to claim 5, wherein said central plate includes a porous plate provided on an upper surface thereof, and said suction source applies said negative pressure to the second surface of the sheet through said porous plate.

7. The apparatus for assembling a flat harness according to claim 1, wherein said covering device further comprises a sheet positioner for aligning the sheet in a predetermined position on said central plate, said first side plate and said second side plate.

8. The apparatus for assembling a flat harness according to claim 7, wherein said sheet positioner includes a sheet end positioning portion for aligning an end of the sheet.

9. The apparatus for assembling a flat harness according to claim 8, wherein said sheet end positioning portion is provided on said second side plate.

10. The apparatus for assembling a flat harness according to claim 7, wherein said sheet positioner includes sheet lateral edge positioning portions for aligning lateral edges of the sheet.

11. The apparatus for assembling a flat harness according to claim 10, wherein said sheet lateral edge positioning portions are provided on said central plate, said first side plate and said second side plate.

12. The apparatus for assembling a flat harness according to claim 1, further comprising:

at least one clamp member for holding a portion of the plurality of juxtaposed electric wires.

13. The apparatus for assembling a flat harness according to claim 12, wherein said at least one clamp member includes two clamp members for holding opposite end portions of the plurality of juxtaposed electric wires.

14. The apparatus for assembling a flat harness according to claim 13, further comprising:

a support member for supporting said covering device in a position between said two clamp members.

15. The apparatus for assembling a flat harness according to claim 14, wherein said support member is movable between a first position in which said covering device is spaced away from the plurality of juxtaposed electric wires and a second position in which said covering device is adjacent to the plurality of juxtaposed electric wires.

16. The apparatus for assembling a flat harness according to claim 15, wherein said engagement device includes an engagement plate connected through a third hinge portion to a side edge of said second side plate in a foldable manner, said engagement plate including a surface which includes a release agent layer provided thereon and which is configured to contact the first surface of the sheet.

17. The apparatus for assembling a flat harness according to claim 15, wherein said engagement device includes a suction source for applying a negative pressure to a second surface of the sheet, said central plate includes a porous plate provided on an upper surface thereof, and said suction source applies said negative pressure to the second surface of the sheet through said porous plate.

18. The apparatus for assembling a flat harness according to claim 15, wherein said covering device further comprises a sheet positioner for aligning the sheet in a predetermined position on said central plate, said first side plate and said second side plate, said sheet positioner including:

a sheet end positioning portion provided on said second side plate for aligning an end of the sheet; and sheet lateral edge positioning portions provided on said central plate, said first side plate and said second side plate, for aligning lateral edges of the sheet.

19. A method for assembling a flat harness, said method comprising.

holding a plurality of juxtaposed electric wires with at least one clamping member;

providing a central plate and a first side plate and a second side plate which are connected in a foldable manner to first and second side edges of said central plate through first and second hinge portions;

providing a sheet having a pressure sensitive adhesive layer on a first surface thereof, wherein the sheer has a central portion, a first lateral portion and a second lateral portion;

mounting the sheet on said central plate, said first side plate and said second side plate;

pressing an engagement plate having a release agent layer onto the second lateral portion of the sheet to hold the second lateral portion of the sheet against said second side plate;

disposing the plurality of juxtaposed electric wires on the central portion of the sheet;

folding said first side plate onto said central plate such that the first lateral portion of the sheet is folded over and fixed on the plurality of juxtaposed electric wires;

releasing the engagement plate from the second lateral portion of the sheet; and folding said second side plate onto said central mounting plate such that the second lateral portion of the sheet is folded over and fixed on the plurality of juxtaposed electric wires.

20. The method for assembling a flat harness according to claim 19, further comprising aligning the sheet on said central plate, said first side plate and said second side plate with a sheet positioner.

* * * * *